United States Patent [19]
Minney

[11] 3,829,795

[45] Aug. 13, 1974

[54] CRYSTAL OSCILLATOR USING FIELD EFFECT TRANSISTORS IN AN INTEGRATED CIRCUIT

[75] Inventor: Jack L. Minney, Long Beach, Calif.

[73] Assignee: Rockwell International Corporation, El Segundo, Calif.

[22] Filed: June 18, 1973

[21] Appl. No.: 371,012

Related U.S. Application Data

[63] Continuation of Ser. No. 171,670, Aug. 13, 1971, abandoned.

[52] U.S. Cl. .......................... 331/116 R, 331/108 D

[51] Int. Cl. .............................................. H03b 5/36

[58] Field of Search .................... 331/108, 116, 117; 307/304, 297; 330/38 M, 35

[56] References Cited

UNITED STATES PATENTS

| | | | |
|---|---|---|---|
| 3,070,762 | 12/1962 | Evans | 330/35 |
| 3,508,084 | 4/1970 | Warner, Jr. | 307/304 |
| 3,649,850 | 3/1972 | Davis | 331/116 R |
| 3,697,777 | 10/1972 | Donoghue | 307/304 |

*Primary Examiner*—John Kominski
*Attorney, Agent, or Firm*—H. Fredrick Hamann; G. Donald Weber, Jr.

[57] ABSTRACT

A crystal controlled oscillator circuit including a constant current source which supplies current to a field effect transistor which amplifies an input signal to provide an output signal to a load which includes a crystal in a feedback path to an input terminal. A bias circuit is connected to the gate electrode of the field effect transistor amplifier.

9 Claims, 1 Drawing Figure

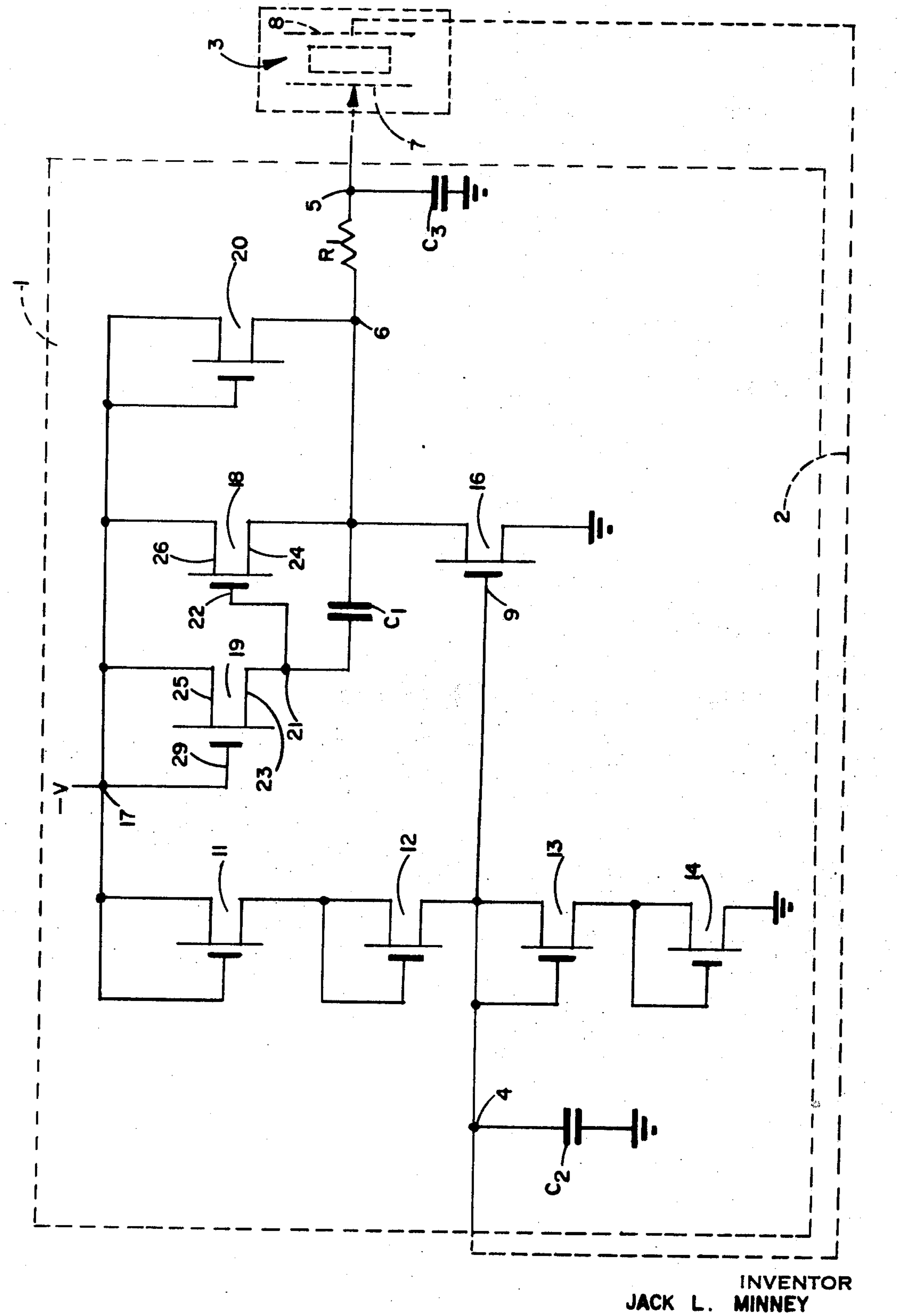
INVENTOR
JACK L. MINNEY
BY Robert G. Rogers
ATTORNEY

CRYSTAL OSCILLATOR USING FIELD EFFECT TRANSISTORS IN AN INTEGRATED CIRCUIT

This is a continuation of application Ser. No. 171,670 filed Aug. 13, 1971, and now abandoned.

BACKGROUND OF THE INVENTION

Field of the Invention

The invention relates to a crystal oscillator circuit using semiconductor devices such as such field effect transistors in an integrated circuit.

Prior art crystal controlled oscillators have typically utilized resistor bias networks and/or bipolar semiconductor devices for implementing the amplifier portion of a crystal oscillator. Experience has indicated that such circuits utilize relatively large amounts of power and often require component matching to achieve the appropriate phase shift to sustain oscillation at the fundamental frequency.

A circuit is required in which the operating characteristics of the semiconductor devices utilized in the circuit vary together. In other words, in an integrated circuit, the threshold voltage levels for each of the devices vary together, e.g., upwards or downwards as a function of process parameters, environmental changes and the like.

SUMMARY OF THE INVENTION

This invention relates to a crystal controlled oscillator using integrated circuit techniques. A biasing circuit establishes a bias signal for an amplifier circuit. A current source is connected in electrical series with the amplifier circuit. The bias signal supplied to the amplifier is selected so that when the circuit is initially turned on, the relatively low voltage signals comprised of transients, noise, etc. are amplified to initiate oscillation. A crystal is connected between the output terminal and the input terminal of the amplifier circuit as part of a feedback circuit. The input terminal of the oscillator circuit is connected to the bias circuit at the same circuit point as the input terminal of the amplifier.

In certain embodiments, phase shifting networks are connected in the feedback circuit to properly adjust the phase shift of the oscillator signal so that a phase shift approximately 360° occurs through the oscillator. A circuit is required in which the operating characteristics of the semiconductor devices utilized in the circuit vary together.

The sole FIGURE is a schematic diagram of a crystal oscillator circuit.

DESCRIPTION OF THE PREFERRED EMBODIMENTS

The FIGURE illustrates a preferred embodiment of a crystal controlled oscillator. The circuit may take the form of an integrated circuit 1 comprised of a plurality of semiconductor devices, such as field effect transistors, as well as other circuit elements such as resistor $R_1$ and capacitors $C_1$, $C_2$, and $C_3$. The integrated circuit portion is represented by the dashed outline. Crystal 3 is connected in feedback loop 2 between input terminal 4 and node 5. Capacitor $C_2$ is connected between input terminal 4 and a suitable reference voltage, for example electrical ground, to reduce circuit sensitivity to stray capacitance. Resistor $R_1$ and capacitor $C_3$ are used to represent an optional phase adjustment network which is used to adjust the phase shift of the circuit for achieving oscillation at the fundamental frequency of crystal 3. The feedback loop 2 and the crystal 3 are illustrated as being external to circuit 1.

The output terminal 6 of the circuit 1 is connected to one terminal of resistor $R_1$. Node 5, a connection between a second terminal of $R_1$ and one terminal of $C_3$, is connected to terminal 7 of crystal 3. Terminal one terminal of 8 of crystal 3 is connected to input terminal 4. Input terminal 4 is also the electrical bias point for the circuit as described subsequently.

A bias voltage for the circuit 1 is provided by field effect transistors 11, 12, 13 and 14 which have the conduction paths thereof connected in electrical series between a first voltage level, e.g., —V and a second voltage level, e.g., electrical ground. The gate electrode of the field effect transistors are connected to the respective drain electrodes thereof. Thus, transistors 11, 12, 13 and 14 function primarily as impedance devices. Input terminal 4, which is electrically connected to a common point between the conductor field effect transistors 12 and 13, is also connected to gate electrode 9 of the amplifier field effect transistor 16. For the particular embodiment shown, relatively high voltage P-channel field effect transistors are utilized. In other embodiments, other types of field effect transistors may also be utilized. The field effect transistors are formed in the same semiconductor area, e.g., a single crystal silicon substrate.

The field effect transistors 11 and 12 have an impedance which is high relative to the impedance of field effect transistors 13 and 14. As a result, the bias voltage at gate electrode 9 is a function of the threshold voltages of transistors 13 and 14 and the relatively high impedance of transistors 11 and 12. At equilibrium conditions, the relatively low (i.e. leakage) current through transistors 11 and 12 establishes the gate to source voltage of transistors 13 and 14 at slightly in excess of the threshold voltages for the devices. Equilibrium conditions exist when a voltage —V is dropped across the four transistors as determined by their respective gate to source voltages. Since a relatively small current is involved, the power consumption is small. The bias voltage at the gate electrode of amplifier transistor 16 is set by the voltage drop across transistors 13 and 14.

The bias voltage, slightly in excess of two threshold voltage drops for the embodiment shown, establishes the conduction level of field effect transistor 16. When the circuit 1 is oscillating, the conduction of field effect transistor 16 is controlled by the voltage swing at its gate electrode 9 between cutoff and the maximum voltage level available as provided by the voltage source —V at terminal 17.

The bias voltage on gate electrode 9 is selected primarily at an operating point so that a relatively high amplification occurs when the circuit is initially turned on. After the circuit is turned on and is oscillating at the maximum output, field effect transistor 16 has a relatively smaller gain. However, during the initial period after turn on, the relatively small voltage variation at the input 4 is highly amplified by field effect transistor 16 for initiating oscillation.

Field effect transistor 20 is connected as a load device between voltage source —V and the node 5 to enable the circuit to become oscillatory at a relatively faster rate. In other words, since field effect transistor 20 is always on, the operation of the constant current source circuit comprising field effect transistors 18, 19 and capacitor $C_1$ is not necessary during the initial operating period of the circuit when the oscillation is increasing. However, after the oscillation has become stable, the constant current source circuit supplies the current through field effect transistor 16.

Field effect transistors 18 and 19 with capacitor $C_1$ provide a constant current circuit for field effect transistor 16 because of the feedback of the voltage from node 6 to node 21. Node 21 is connected to the gate electrode 22 of field effect transistor 18 and the source electrode 23 of field effect transistor 19.

The gate electrode 29 and drain electrode 25 of field effect transistor 19 are connected to terminal 17. The drain electrode 26 of field effect transistor 18 is also connected to the terminal 17 of voltage source —V.

During the operation, when field effect transistor 16 is on and node 6 is at its maximum positive voltage, e.g., —3V, capacitor $C_1$ is enabled to charge to the difference between the output voltage and —V reduced by the threshold voltage drop across field effect transistor 19. Thereafter, when the output voltage at node 6 goes more negative due to the change in the conduction of field effect transistor 16, the output voltage change is fed back across capacitor $C_1$ to node 21 for increasing the conduction of field effect transistor 18. Since the gate voltage relative to the source voltage remains the same, the current through field effect transistor 18 remains substantially constant. As a result, the circuit including field effect transistors 18 and 19 as well as capacitor $C_1$ can be considered as a relatively constant current source. As the voltage at node 21 increases to approximately —V, the voltage between the gate and source electrodes of field effect transistor 19 is reduced below a threshold level so that field effect transistor 19 is turned off.

In order to describe one embodiment, it is assumed that the threshold voltage levels for the field effect transistor devices are within the range of 2.7 to 4.7 volts. As a result, it is assumed that gate electrode 9 is at approximately —7 or —8 volts. The output voltage may vary between —3 and —17 volts for a source voltage of —20 volts.

When the circuit is initially turned on, the voltage at input terminal 4 may increase from approximately —7 volts to —8 or —8½ volts due to transient conditions. The increase is amplified by field effect transistor 16 so that the output voltage becomes more negative. It may be amplified, for example, by a factor of 3 to 6.

The amplified voltage is fedback across resistor $R_1$, capacitor $C_3$, crystal 3 and capacitor $C_2$ to the input terminal 4. The 360° of phase shift through the circuit including the feedback loop consists of slightly over 180° through the circuit 1 excluding $R_1C_3$, and slightly under 180° between node 6 and input terminal 4. The signal at node 6 is shifted in phase by $R_1C_3$ so that the crystal does not have to shift the signal by 180°. The operation of the circuit is believed more satisfactory when the crystal is not forced to shift the signal by 180°.

When the circuit is oscillating at its fundamental frequency, the output voltage oscillates between its most positive value and its most negative value. The oscillator forces the output voltage to vary accordingly in a sinusoidal manner around the bias voltage level at gate electrode 9.

The relatively high gain through the field effect transistor 16 occurs during the initial turn on time when it is important to amplify the transient voltage at input terminal 4. After the oscillation has built up, it is no longer necessary to maintain the relatively high gain and the circuit automatically reaches an operating gain which is relatively lower.

Thus, there has been shown and described a crystal controlled oscillator circuit which utilizes semiconductors such as field effect transistors in a unique arrangement for achieving a small, low power, precision frequency oscillator. The circuit is readily adaptable for implementation in integrated circuit form.

A preferred embodiment of the invention has been described. Of course, other modifications or variations of the circuit may be readily developed by those skilled in the art. For example, in some applications of this invention, the phase control RC network in the feedback circuit (comprising resistor $R_1$ and capacitor $C_3$) may be unnecessary. Therefore, this RC network may be eliminated in some applications. However, any and all modifications which fall within the purview of the description are intended to be included herein. The scope of the invention is to be limited only by the appended claims.

Having thus described the invention, what is claimed is:

1. A crystal oscillator circuit using a plurality of field effect transistors, each of said field effect transistors having at least source, drain and gate electrodes, said source and drain electrodes defining a conduction path therebetween, said gate electrode controlling the conduction through said conduction path, said oscillator circuit comprising, a bias network comprising at least two field effect transistors having the conduction paths thereof connected in electrical series for establishing a bias voltage level at a connection between the series connected conduction paths of said field effect transistors, an amplifier field effect transistor having the gate electrode thereof connected to said connection of said bias network to thereby receive said bias voltage level, a substantially constant current source connected to the conduction path of said amplifier field effect transistor to supply a substantially constant current thereto, and a crystal connected as a feedback path around said amplifier field effect transistor, said substantially constant current source comprising a field effect transistor circuit including a first field effect transistor having the conduction path thereof connected in electrical series between a first voltage level and the conduction path of said amplifier field effect transistor, a feedback capacitor connected between the gate electrode of said first field effect transistor and a common point between said first field effect transistor and said amplifier field effect transistor, and a second field effect transistor having the conduction path thereof connected between said first voltage level and the gate electrode of said first field effect transistor, said second field effect transistor providing charge current to said feedback capacitor whereby voltage levels fed back from said common point to said gate electrode control the conduction of said first field effect transistor for providing a substantially constant current source to said amplifier field effect transistor.

2. The crystal oscillator circuit recited in claim 1 wherein said crystal is connected between the gate electrode of said amplifier field effect transistor and one of the electrodes defining the conduction path of said amplifier field effect transistor.

3. The crystal oscillator circuit recited in claim 1 further including a third field effect transistor having the conduction path thereof connected in electrical parallel with the conduction path of said first field effect transistor for providing current to said amplifier field effect transistor during the initial period of oscillation.

4. The crystal oscillator circuit recited in claim 3 wherein said oscillator circuit includes an input terminal, an output terminal, phase adjusting circuitry connected between said input and output terminals for adjusting the phase of the oscillating signal to the fundamental oscillating frequency of said crystal, and said input terminal being connected to said connection on said bias network to receive the bias voltage level and said output terminal connected to the common point between said amplifier field effect transistor and said first field effect transistor.

5. The crystal oscillator circuit recited in claim 1 wherein the bias network comprises field effect transistors having the gate and drain electrodes thereof connected together, and wherein field effect transistors connected between the bias voltage level connection and a first voltage level have a relatively higher impedance than field effect transistors connected between the bias voltage level connection and a second voltage level, whereby the current level through the first recited field effect transistors and the threshold voltage levels of the second recited field effect transistor determine the bias voltage level.

6. The crystal oscillator circuit recited in claim 5 wherein said bias voltage level connection between said series connected field effect transistors is selected as a function of the threshold voltage level of said amplifying field effect transistor when the oscillator circuit is turned on, the transient signal conditions on the biased gate electrode of said amplifier field effect transistor receives a relatively high amplification for enabling said circuit to oscillate at the fundamental frequency of said crystal.

7. The combination recited in claim 1 wherein said bias network includes a plurality of field effect transistors connected in electrical series, each of said semiconductor devices connected as a substantially passive device for establishing voltage differences thereacross.

8. The combination recited in claim 1 wherein said feedback path includes a crystal having established frequency controlling characteristics.

9. The combination recited in claim 1 wherein said feedback path further includes phase shifting means connected to said crystal to permit adjustment of the phase of the signal produced by said feedback means.

* * * * *

PO-1050
(5/69)

UNITED STATES PATENT OFFICE
CERTIFICATE OF CORRECTION

Patent No. 3,829,795 Dated August 13, 1974

Inventor(s) Jack L. Minney

It is certified that error appears in the above-identified patent and that said Letters Patent are hereby corrected as shown below:

Column 1, lines 45 through 48, delete "A circuit is required in which the operating characteristics of the semiconductor devices utilized in the circuit vary together."

Column 1, between lines 48 and 49, insert the heading --BRIEF DESCRIPTION OF THE DRAWING--.

Column 2, lines 7 and 8, delete "one terminal of".

Signed and sealed this 12th day of November 1974.

(SEAL)
Attest:

McCOY M. GIBSON JR.
Attesting Officer

C. MARSHALL DANN
Commissioner of Patents